(12) United States Patent
Wilcox et al.

(10) Patent No.: US 10,582,650 B2
(45) Date of Patent: Mar. 3, 2020

(54) POWER SUPPLY WITH INTERCHANGEABLE FAN MODULE

(71) Applicant: Arista Networks, Inc., Santa Clara, CA (US)

(72) Inventors: Robert Wilcox, Santa Clara, CA (US); Richard Neville Hibbs, Santa Clara, CA (US); Robert Cyphers, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 0 days.

(21) Appl. No.: 16/159,511

(22) Filed: Oct. 12, 2018

(65) Prior Publication Data

US 2019/0116696 A1   Apr. 18, 2019

Related U.S. Application Data

(60) Provisional application No. 62/572,342, filed on Oct. 13, 2017.

(51) Int. Cl.
*H05K 7/00* (2006.01)
*H05K 7/20* (2006.01)

(52) U.S. Cl.
CPC ..... *H05K 7/20945* (2013.01); *H05K 7/20172* (2013.01); *H05K 7/20209* (2013.01)

(58) Field of Classification Search
CPC .......... H05K 7/20945; H05K 7/20172; H05K 7/20209; H05K 7/20
USPC ......... 361/695; 700/276, 282, 275, 299, 304
See application file for complete search history.

(56) References Cited

U.S. PATENT DOCUMENTS

| 7,021,367 | B2 * | 4/2006 | Oikawa | F28D 15/02 165/185 |
| 2002/0067277 | A1 * | 6/2002 | Nishimura | G06F 1/20 340/635 |
| 2004/0240177 | A1 * | 12/2004 | Suzuki | H05K 7/20581 361/695 |
| 2006/0142901 | A1 * | 6/2006 | Frankel | H05K 7/20209 700/300 |

(Continued)

*Primary Examiner* — William H. Mayo, III
(74) *Attorney, Agent, or Firm* — Fountainhead Law Group P.C.

(57) ABSTRACT

A power supply includes a power supply unit. The power supply unit includes a first housing configured to interface with one or more of housings of one or more fan modules. The power supply unit also includes a power generation unit disposed within the housing. The power generation unit may be configured to generate power for an electrical device. The power supply further includes a first connector configured to provide power to the one or more fan modules. The power may be used to operate one or more fan units of the one or more fan modules. The power supply also includes a fan module. The fan module includes a second housing configured to interface with the first housing. The fan module also includes a fan unit disposed within the second housing. The fan unit may be configured to generate an airflow through the first housing. The fan module further includes a first attachment member configured to interface with the first connector. The fan module further includes a second connector configured to receive power from the one or more power supplies and provide the power to the fan unit.

21 Claims, 5 Drawing Sheets

(56) References Cited

U.S. PATENT DOCUMENTS

| | | | |
|---|---|---|---|
| 2006/0169789 A1* | 8/2006 | Barsun | G06F 1/20 236/49.3 |
| 2008/0004755 A1* | 1/2008 | Dunstan | G06F 1/20 700/299 |
| 2008/0239655 A1* | 10/2008 | Oyama | G11B 33/128 361/679.37 |
| 2010/0042852 A1* | 2/2010 | Yin | G06F 1/26 713/300 |
| 2010/0087956 A1* | 4/2010 | Regimbal | H05K 7/2019 700/276 |
| 2011/0242759 A1* | 10/2011 | Lu | H05K 7/20172 361/695 |
| 2012/0079307 A1* | 3/2012 | Lieberman | G06F 1/28 713/340 |
| 2012/0219413 A1* | 8/2012 | Charest | F04D 25/0613 415/213.1 |
| 2012/0286600 A1* | 11/2012 | Lang | H02K 11/0094 310/63 |
| 2014/0118937 A1* | 5/2014 | Adrian | H05K 7/20172 361/695 |
| 2016/0275773 A1* | 9/2016 | Dharmadhikari | H01R 13/00 |
| 2018/0279513 A1* | 9/2018 | Tabuchi | G06F 1/206 |

* cited by examiner

POWER SUPPLY WITH INTERCHANGEABLE FAN MODULE

CROSS-REFERENCE TO RELATED APPLICATIONS

This application claims the benefit of U.S. Provisional Patent Application No. 62/572,342, filed on Oct. 13, 2017. The disclosure of the above-referenced application is hereby incorporated by reference in its entirety.

BACKGROUND

Electronic devices use power to perform various tasks, functions, operations, etc., and/or to operate various components of the electronic devices. For example, an electronic device may use power to operate a screen (e.g., a touch screen, a liquid crystal display (LCD), etc.). In another example, an electronic device may use power to generate operate a processing device (e.g., a central processing unit, a processor) to execute applications that are executing on the electronic device. In a further example, an electronic device (e.g., a network device such as a router or switch) may use power to operate ports (e.g., network ports) and to perform various tasks (e.g., route or forward packets). Electronic devices may use power supplies to generate the power used by the electronic devices.

The components of the power supplies (e.g., voltage regulators, rails, wires, pins, connectors, capacitors, transistors, etc.) generate heat and may use active cooling (such as an airflow generated by a fan) to help prevent overheating of the components and/or the power supplies. For example, when power supply components are grouped closely together, the quantity of heat generated by the power supply components is sometimes sufficient to increase the temperature of the environment surrounding the power supply components. Further, the power supply components are housed in structures (e.g., housing, a case, etc.) that trap hot air around the power supply components which further increases the temperature of the power supply and/or the power supply components.

SUMMARY

In some implementations, a power supply is provided. The power supply includes a first housing configured to interface with one or more of housings of one or more fan modules. The power supply also includes a power generation unit disposed within the housing. The power generation unit may be configured to generate power for an electrical device. The power supply further includes a first connector configured to provide power to the one or more fan modules. The power is used to operate one or more fan units of the one or more fan modules.

In some implementations, a fan module is provided. The fan module includes a first housing configured to interface with one or more housings of one or more power supplies. The fan module also includes a fan unit disposed within the first housing. The fan unit may be configured to generate an airflow. The fan module further includes a first attachment member configured to interface with one or more connectors of the one or more power supplies. The fan module further includes a first connector configured to receive power from the one or more power supplies and provide the power to the fan unit.

In some implementations, a power supply is provided. The power supply includes a power supply unit. The power supply unit includes a first housing configured to interface with one or more of housings of one or more fan modules. The power supply unit also includes a power generation unit disposed within the housing. The power generation unit may be configured to generate power for an electrical device. The power supply further includes a first connector configured to provide power to the one or more fan modules. The power may be used to operate one or more fan units of the one or more fan modules. The power supply also includes a fan module. The fan module includes a second housing configured to interface with the first housing. The fan module also includes a fan unit disposed within the second housing. The fan unit may be configured to generate an airflow through the first housing. The fan module further includes a first attachment member configured to interface with the first connector. The fan module further includes a second connector configured to receive power from the one or more power supplies and provide the power to the fan unit.

In some implementations a method is provided. The method includes determining whether a fan module is coupled to a power supply. A first housing of the power supply is configured to interface with a second housing of the fan module, an attachment member of the fan module is configured to interface with a first connector of the power supply, and the first connector is configured to couple with a second connector of the fan module. The method also includes obtaining configuration parameters of the fan module. The method further includes determining whether the fan module is compatible with the power supply based on the configuration parameters. The method further includes, in response to determining that the fan module is not compatible with the power supply, preventing improper operation of the power supply.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

As discussed above, electronic devices use power to perform various task, functions, operations, etc., and/or to operate various components of the electronic devices. Electronic devices may use power supplies to generate the power used by the electronic devices. Power supplies often include integrated fans or fan modules.

Figure 1A:
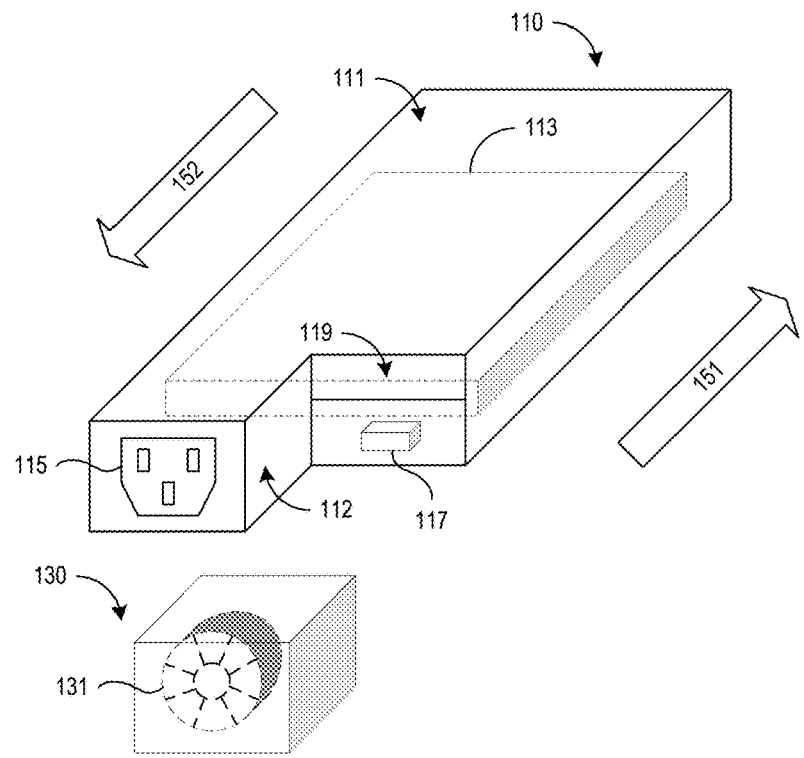
FIG. 1A illustrates a perspective view of a power supply and a fan module in accordance with one or more embodiments of the present disclosure.

FIG. 1A illustrates a perspective view (e.g., an isometric view) of a power supply 110 and a fan module 130 in accordance with one or more embodiments of the present disclosure. As discussed above, the power supply 110 may generate power that may be used by an electronic device. The power supply 110 may also be referred to as a power supply unit (PSU). The power supply 110 and the fan module 130 are illustrated before the fan module 130 is coupled to the power supply 110.

The fan module 130 includes one or more attachment members (not visible in FIG. 1A), a connector (not visible in FIG. 1A), a housing 131, and a fan unit 233. The connector of the fan module 130 may allow the fan module 130 to be coupled to the power supply 110, as discussed in more detail below. The connector (of the fan module) may allow the fan module 130 to receive power from the power supply 110. The power (received from the power supply 110) may be used to operate the fan unit 131. For example, the power (received from the power supply 110) may be used to rotate/turn a fan of the fan unit 131 to generate airflow. In one embodiment, the fan unit 131 may generate an air flow that goes in the direction of arrow 151 (e.g., blows air into the housing 111 of the power supply 110). In another embodiment, the fan unit 131 may generate an air flow that goes in the direction or arrow 152 (e.g., sucks air out of the housing 111 of the power supply 110). One having ordinary skill in the art understands that various types of fans may be used in the fan unit. For example, a fan may be an axial-flow fan (e.g., a fan with blades), a centrifugal fan, etc. In addition, the fan module 130 may include multiple fans and/or multiple types of fans.

The power supply 110 includes a connector 115. The connector 115 may couple the power supply 110 to an external power source. For example, the connector 115 may be an International Electrotechnical Commission (IES) 320 connector that may couple the power supply 110 to a wall socket. The connector 115 may receive alternating current (AC) power from the wall socket and may provide the AC power to the power generation unit 113. In some embodiments, the connector 115 may also provide a portion of the power received via the connector 115 to the connector 117, and the connector 117 may provide the portion of the power to the fan module 130, as discussed in more detail below.

The power supply 110 also includes a power generation unit 113. The power generation unit may 113 may generate power for an electronic device (e.g., a desktop computer, a server computer, a network device such as a router or a switch, a rack mount server or rack mount network device, etc.). The power generation unit 113 may include various power supply components. Power supply components may be components (e.g., devices, hardware, circuits, etc.) that may be used to convert power, boost voltage (e.g., a boost circuit), decrease voltage (e.g., a buck circuit), condition power, generate power, etc. Examples of power supply components may include, but are not limited to wires, pins, traces, rails, capacitors, transistors, voltage regulators, voltage converters, boost circuits, buck circuits, connectors, etc. The power generation unit 113 may generate power for the electronic device using the power received from the external power source (via connector 115). In one embodiment, the power generation unit 113 may generate direct current (DC) power. In another embodiment, the power generation unit 113 may generate AC power. The power supply 110 may also include a connector (not illustrated in FIG. 1A) that couples the power supply 110 to the electronic device. The power supply 110 may provide power to the electronic device via the connector (e.g., connector 237 illustrated in FIGS. 2A-3B). The power supply 110 may also receive data and/or signals from the electronic device via the connector. For example, the power supply 110 may receive messages indicating whether the power supply 110 should perform an operation.

The power supply 110 further includes a connector 117. The connector 117 may allow the power supply 110 to be coupled to the fan module 130. The connector 117 may include one or more wires, pins, traces, lines, etc., that allow the connector 117 to receive power from the power supply 110 (e.g., from the power generation unit 113 or directly from the external power source via connector 115) and provide the power to the fan module 130.

The power supply 110 includes a housing 111. The housing 111 may be structure that encloses one or more components of the power supply 110 (e.g., one or more power supply components). For example, the power supply 110 may include various wires, pins, traces, rails, capacitors, transistors, voltage regulators, converters, etc., which may be located within the housing 111. The housing 111 may be constructed of various materials. For example, the housing 111 may be constructed of one or more of a metal or metallic material, a plastic material, a polymer, an alloy, etc. In some embodiments, the housing 111 may partially enclose the power supply components and/or the power generation unit 113.

As illustrated in FIG. 1A, the housing 111 includes a space, void, cavity, etc., in the lower right portion of the housing 111 such that the housing 111 has a "P" shape. The housing 111 of the power supply 110 is configured to interface with the housing 131 of the fan module 130. For example, the housing 131 (of the fan module 130) is configured to fit within the void/cavity formed by the housing 111 (of the power supply 110), as discussed in more detail below. For example, wall 112 of the housing 111 may touch, contact, abut, etc., one of the walls of the housing 131. In another example, wall 119 may touch, contact, abut, etc., one of the walls of the housing 131. In some embodiments, the housing 111 and/or the housing 131 may include various alignment features that may allow the housing 111 to interface with the housing 131. For example, the housing 111 and/or the housing 131 may include railings, slits, tabs, holes, notches, prongs, etc., that may be used to align the housing 111 with the housing 131, or vice versa.

In one embodiment, the shape of the housing 111 allows the housing 111 to interface with multiple different fan modules. For example, there may be other fan modules that having housings similar or identical to the housing 131 (e.g., the height, width, depth, size, shape, etc., of the other housings may be similar or identical to the housing 131). In another embodiment, the different fan modules may also include connectors that are configured to couple/interface with connector 117 of the power supply 110. For example, the different fan modules may include connectors that fit into the connector 117 of the power supply 110. In another example, the connector 117 may fit into the connectors of the different fan modules. In a further embodiment, the positioning of the connector 117 and the connectors of the different fan modules may also be aligned such that the connector 117 will be able to properly interface with the connectors of the different fan modules. For example, the vertical and/or horizontal position of the connector 117 may match the vertical and/or horizontal positions of the connectors of the different fan modules when the different fan modules are coupled to the power supply 110.

Using fan modules with similar/identical housings, the same connectors, and/or same positions/locations for the connectors may allow the power supply 110 to be coupled with different fan modules attached to the power supply 110 (e.g., may provide the ability to interchange the fan modules coupled to the power supply 110). The ability to interchange the different fan modules with different power supplies may provide various benefits.

In one embodiment, the ability to interchange the fan modules that are used with the power supply 110 may allow for a more efficient manufacturing process. For example, instead of manufacturing power supplies with integrated fans, the power supplies and the fan modules may be manufactured separately (e.g., by separate vendors). This may allow fewer versions of a power supply to be manufactured. For example, instead of manufacturing a first version of a power supply (with an integrated fan) where the fan blows air into the power supply and manufacturing a second version of the power supply (with an integrated fan) where the fan sucks air out of the power supply, one single version of the power supply may be manufactured and the fan modules may be interchanged to use either a fan module the blows air into the power supply or a fan module that sucks air out of the power supply.

In another embodiment, the ability to interchange the fan modules that are used with the power supply 110 may allow the power supply 110 to be manufactured more cheaply. For example, different fan modules may have different air flow rates (e.g., may move a different amount of air during a period of time). One fan module may have a first airflow rate (e.g., 20 cubic feet per minute (CFM)) and another fan module may have a second airflow rate (e.g., 10 CFM). Based on the load placed on the power supply 110 (e.g., based on the amount of power the power supply 110 is generating), different fan modules may be used to cool down the power supply 110 and/or the power supply components. For example, if an electronic device uses a smaller amount of power, a cheaper (e.g., cheaper in cost) fan module with a lower airflow rate may be coupled to the power supply 110 because the power supply may not generate as much heat. In another example, if an electronic device uses a larger amount of power, a more expensive (e.g., more costly) fan module with a higher airflow rate may be coupled to the power supply 110 because the power supply may generate more heat.

In one embodiment, the ability to interchange the fan modules that are used with the power supply 110 may allow the power supply 110 to be more easily adapted to the electronic device that may use the power supply 110. For example, based on the location in the electronic device where the power supply 110 is installed, it may be more beneficial for the power supply 110 to blow air through housing 111 or suck air out of the housing 111. For example, if the power supply 110 is installed along an edge/wall of the electronic device, it may be better to cool the power supply 119 by sucking the air out of the housing 111. The ability to interchange the fan modules allows the same power supply 110 to be used by swapping out the fan module based on whether it is more beneficial for the power supply 110 to blow air through housing 111 or suck air out of the housing 111.

In another embodiment, the ability to interchange the fan modules that are used with the power supply 110 may allow the power supply 110 to be more easily adapted to the environment where the power supply 110 is used. For example, if the power supply 110 is used in an environment (e.g., in a room) where less noise is desired, a quieter fan module with a lower airflow rate may be coupled to the power supply 110 because the fan module with the lower airflow rate may not generate as much noise. In another example, if the power supply is used in a noisy environment (e.g., a server room, a data center) where low noise is not as important, a louder fan with a higher airflow rate may be coupled to the power supply 110 because the fan module with the higher airflow rate may generate more noise.

In one embodiment, the ability to interchange the fan modules that are used with the power supply 110 may allow the power supply 110 to be more easily maintained and/or upgraded. For example, if a fan module fails (e.g., is not operable, is no longer able to generate air flow), the fan module may be swapped out for another fan module. In another example, if more/better cooling performance is desired, an older fan module may be swapped out for a new or higher performance fan module.

In one embodiment, the fan module 130 may include a memory. For example, the fan module 130 may include hardware, circuits, etc., to store data. Examples of memory may include flash memory, a read-only memory (ROM), a cache, etc. The memory may store configuration parameters for the fan module 130. For example, the memory may store information such as the amount of air flow that the fan module 130 may provide (e.g., a minimum CFM and a maximum CFM), the amount of noise generated by the fan module 130, the direction of the air flow, power requirements for the fan module 130 (e.g., the amount of power used by the fan module 130), the rotations per minute (RPMs) of the fan unit 131, the amount of time that the fan unit 131 has been operating (e.g., how long the fan unit 131 has been creating airflow), an estimated time to failure, etc.

In one embodiment, the power supply 110 may include a controller (e.g., a processor, a processing device, an application-specific integrated circuit (ASIC), a field-programmable gate array (FPGA), etc.). The controller may obtain one or more configuration parameters from the fan module 130. For example, the power supply 110 may read the memory of the fan module 130 via the connector 117 and the connector of the fan module 130. In another example, the controller may request the configuration parameters (e.g., via a message, frame, packet, etc.) and the fan module 130 may transmit the configuration parameters (e.g., via a message, frame, packet, etc.) to the controller.

The controller may analyze the configuration parameters to determine whether the fan module 130 is compatible with the power supply 110. For example, the controller may determine whether the airflow direction of the fan module 130 is compatible with the power supply 110 (e.g., whether the fan module 130 is capable of meeting the cooling requirements of the power supply 110). In another example, the controller may determine whether the air flow rate (e.g., the amount of CFM) of the fan module is sufficient to cool the power supply 110. In a further example, the controller may determine if the estimated time to failure of the fan module is greater than a threshold time. If the fan module 130 is compatible with the power supply 110, the controller may allow the fan module 130 to operate. If the fan module 130 is not compatible with the power supply 110, the controller may provide an indication that the fan module 130 is not compatible with the power supply 110. For example, the controller may activate a visual indicator (e.g., a light-emitting diode (LED)) on the power supply 110 to indicate that the fan module 130 is not compatible with the power supply 110. In another example, the controller may transmit a message to the electronic device indicating that the fan module 130 is not compatible with the power supply 110.

Figure 1B:
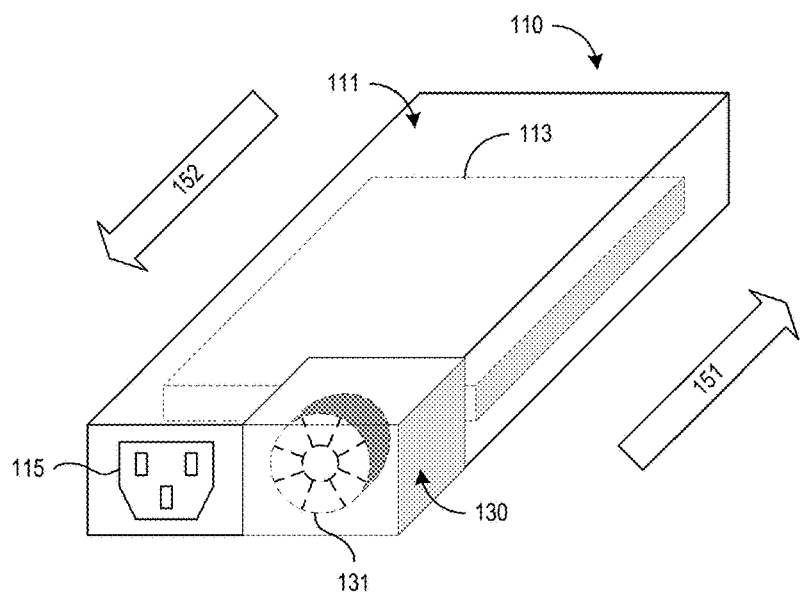
FIG. 1B illustrates a perspective view of a power supply and a fan module in accordance with one or more embodiments of the present disclosure.

FIG. 1B illustrates a perspective view of a power supply 110 and a fan module 130 in accordance with one or more embodiments of the present disclosure. The power supply 110 and the fan module 130 are illustrated after the fan module 130 is coupled to the power supply 110.

The fan module 130 includes one or more attachment members (not visible in FIG. 1B), a connector (not visible in FIG. 1B), a housing 131, and a fan unit 233 as discussed above. The connector of the fan module 130 may couple the fan module 130 to the power supply and may allow the fan module 130 to receive power from the power supply 110 (to operate fan unit 131). The fan unit 131 may generate an air flow that goes in the direction of arrow 151 or in the direction or arrow 152. The fan module 130 may include a memory to store configuration parameters, as discussed above.

The power supply 110 includes a connector 115 to couple the power supply 110 to an external power source, as discussed above. The power supply 110 also includes a power generation unit 113, as discussed above. The power generation unit 113 may convert power, boost voltage, decrease voltage, condition power, generate power, etc., as discussed above. The power supply 110 further includes a connector 117 to couple the fan module 130 to the power supply 110, as discussed above. The power supply 110 may also include a connector (not illustrated in FIG. 1B) that couples the power supply 110 to the electronic device, as discussed above. The power supply 110 may also include a controller that may obtain one or more configuration parameters from the fan module 130 and may determine whether the fan module 130 is compatible with the power supply 110 (based on the configuration parameters), as discussed above.

The power supply 110 includes a housing 111, as discussed above. The housing 111 of the power supply 110 interfaces with the housing 131 of the fan module 130 when the fan module 130 is coupled to the power supply 110 (e.g., walls 112 and 119 interface with housing 131), as discussed above. In some embodiments, the housing 111 and/or the housing 131 may include various alignment features that may allow the housing 111 to interface with the housing 131. The resulting combination of the power supply 110 and the fan module 130 has the general shape of a rectangle or a rectangular prism. Although a rectangular shape is illustrated in FIG. 1B, other geometric shapes (e.g., squares, triangles, circles, etc.) and/or other irregular shapes may be formed when the power supply 110 is combined with the fan module 130.

As discussed above, the shape of the housing 111 allows the housing 111 to interface with multiple different fan modules. Also as discussed above, the connector 117 and the connectors of the fan modules may be aligned/positioned such that the connectors 117 will couple with the connectors of the fan modules when the fan modules are inserted into the space in the housing 111. Using fan modules with similar/identical housings, the same connectors, and/or same positions/locations for the connectors may provide the ability to interchange the fan modules coupled to the power supply 110. The ability to interchange the different fan modules with different power supplies may provide various benefits (e.g., more efficient manufacturing process, cheaper manufacturing, the ability to customize the power supply 110 to the requirements of the electronic device/environment, easier maintenance/upgrading, etc.), as discussed above.

Figure 2A:
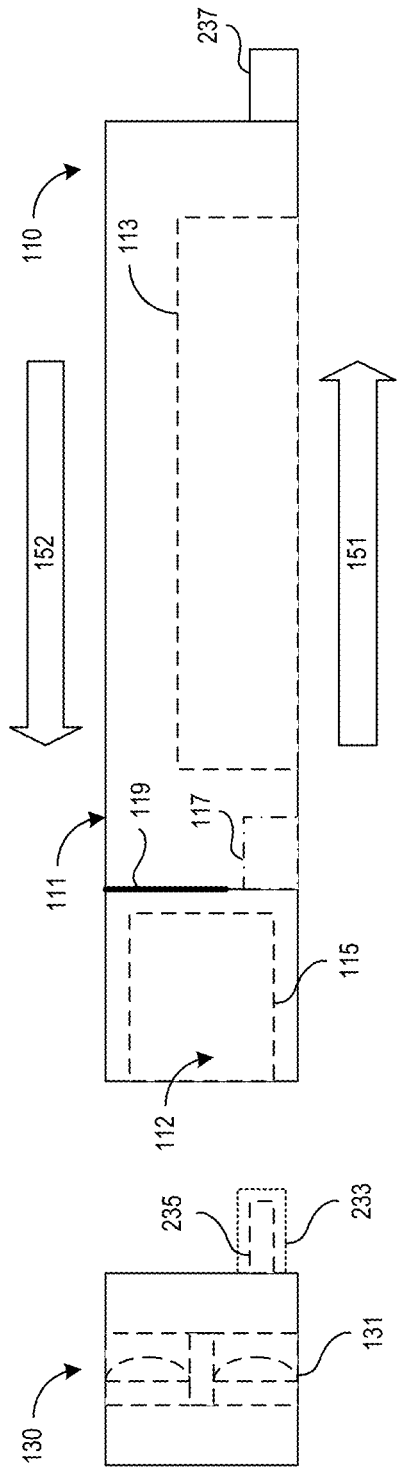
FIG. 2A illustrates a side view of a power supply and a fan module in accordance with one or more embodiments of the present disclosure.

FIG. 2A illustrates a side view of a power supply 110 and a fan module 130 in accordance with one or more embodiments of the present disclosure. The power supply 110 and the fan module 130 are illustrated before the fan module 130 is coupled to the power supply 110.

The fan module 130 includes one or more attachment members 233, a connector 235, a housing 131, and a fan unit 233 as discussed above. The connector 235 may couple the fan module 130 to the power supply and may allow the fan module 130 to receive power from the power supply 110. The power (received from the power supply 110) may be used to operate the fan unit 131. The fan unit 131 may generate an air flow that goes in the direction of arrow 151 or in the direction or arrow 152. The fan module 130 may include a memory to store configuration parameters, as discussed above. The attachment members 233 may be configured to align or interface with the connector 117. For example, the attachment members 233 may be configured to contact the outer faces of the connector 117. This may align the connector 117 with the connector 235 when the fan module 130 is coupled to the power supply (e.g., is inserted into the space in the housing 111).

Although the attachment members 233 are illustrated as part of the fan module 130, the attachment members 233 may be located in other components or there may be more attachment members in other embodiments. For example, the attachment members 233 may be located proximate to the connector 117 within the housing 111. In another example, the power supply 110 may include additional attachment members that may interface with or align with the attachment members 233.

The power supply 110 includes a connector 115 to couple the power supply 110 to an external power source, as discussed above. The power supply 110 also includes a power generation unit 113, as discussed above. The power generation unit 113 may convert power, boost voltage, decrease voltage, condition power, generate power, etc., as discussed above. The power supply 110 further includes a connector 117 to couple the fan module 130 to the power supply 110, as discussed above. The power supply 110 may also include a connector 237 that couples the power supply 110 to the electronic device, as discussed above. The power supply 110 may also include a controller that may obtain one or more configuration parameters from the fan module 130 and may determine whether the fan module 130 is compatible with the power supply 110 (based on the configuration parameters), as discussed above.

The power supply 110 includes a housing 111, as discussed above. The housing 111 of the power supply 110 interfaces with the housing 131 of the fan module 130 when the fan module 130 is coupled to the power supply 110 (e.g., walls 112 and 119 interface with housing 131), as discussed above. In some embodiments, the housing 111 and/or the housing 131 may include various alignment features that may allow the housing 111 to interface with the housing 131.

As discussed above, the shape of the housing 111 allows the housing 111 to interface with multiple different fan modules. Also as discussed above, the connector 117 and the connectors of the fan modules may be aligned/positioned such that the connectors 117 will couple with the connectors of the fan modules when the fan modules are inserted into the space in the housing 111. Using fan modules with similar/identical housings, the same connectors, and/or same positions/locations for the connectors may provide the ability to interchange the fan modules coupled to the power supply 110. The ability to interchange the different fan modules with different power supplies may provide various benefits (e.g., more efficient manufacturing process, cheaper manufacturing, the ability to customize the power supply 110 to the requirements of the electronic device/environment, easier maintenance/upgrading, etc.), as discussed above.

Figure 2B:
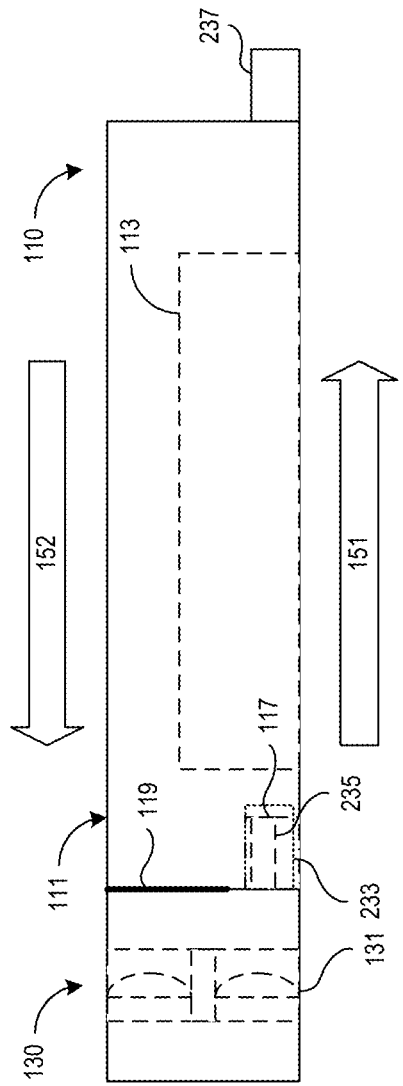
FIG. 2B illustrates a side view of a power supply and a fan module in accordance with one or more embodiments of the present disclosure.

FIG. 2B illustrates a side view of a power supply 110 and a fan module 130 in accordance with one or more embodiments of the present disclosure. The power supply 110 and the fan module 130 are illustrated after the fan module 130 is coupled to the power supply 110.

The fan module 130 includes one or more attachment members 233, a connector 235, a housing 131, and a fan unit 233 as discussed above. The connector 235 may couple the fan module 130 to the power supply and may allow the fan module 130 to receive power from the power supply 110. The power (received from the power supply 110) may be used to operate the fan unit 131. The fan unit 131 may generate an air flow that goes in the direction of arrow 151 or in the direction or arrow 152. The fan module 130 may include a memory to store configuration parameters, as discussed above. As illustrated in FIG. 2B, the attachment members 233 align or interface with the connector 117. The attachment members 233 may be configured to contact the outer faces of the connector 117 in order to align the connector 117 with the connector 235 when the fan module 130 is coupled to the power supply (e.g., is inserted into the space in the housing 111). This allows the connector 117 to be properly coupled with connector 235

Although the attachment members 233 are illustrated as part of the fan module 130, the attachment members 233 may be located in other components or there may be more attachment members in other embodiments. For example, the attachment members 233 may be located proximate to the connector 117 within the housing 111. In another example, the power supply 110 may include additional attachment members that may interface with or align with the attachment members 233.

The power supply 110 includes a connector 115 to couple the power supply 110 to an external power source, as discussed above. The power supply 110 also includes a power generation unit 113, as discussed above. The power generation unit 113 may convert power, boost voltage, decrease voltage, condition power, generate power, etc., as discussed above. The power supply 110 further includes a connector 117 to couple the fan module 130 to the power supply 110, as discussed above. The power supply 110 may also include a connector 237 that couples the power supply 110 to the electronic device, as discussed above. The power supply 110 may also include a controller that may obtain one or more configuration parameters from the fan module 130 and may determine whether the fan module 130 is compatible with the power supply 110 (based on the configuration parameters), as discussed above.

The power supply 110 includes a housing 111, as discussed above. The housing 111 of the power supply 110 interfaces with the housing 131 of the fan module 130 when the fan module 130 is coupled to the power supply 110 (e.g., walls 112 and 119 interface with housing 131), as discussed above. In some embodiments, the housing 111 and/or the housing 131 may include various alignment features that may allow the housing 111 to interface with the housing 131. The resulting combination of the power supply 110 and the fan module 130 has the general shape of a rectangle or a rectangular prism, although other shapes may be formed in other embodiments.

As discussed above, the shape of the housing 111 allows the housing 111 to interface with multiple different fan modules. Also as discussed above, the connector 117 and the connectors of the fan modules may be aligned/positioned such that the connectors 117 will couple with the connectors of the fan modules when the fan modules are inserted into the space in the housing 111. Using fan modules with similar/identical housings, the same connectors, and/or same positions/locations for the connectors may provide the ability to interchange the fan modules coupled to the power supply 110. The ability to interchange the different fan modules with different power supplies may provide various benefits (e.g., more efficient manufacturing process, cheaper manufacturing, the ability to customize the power supply 110 to the requirements of the electronic device/environment, easier maintenance/upgrading, etc.), as discussed above.

Figure 3A:
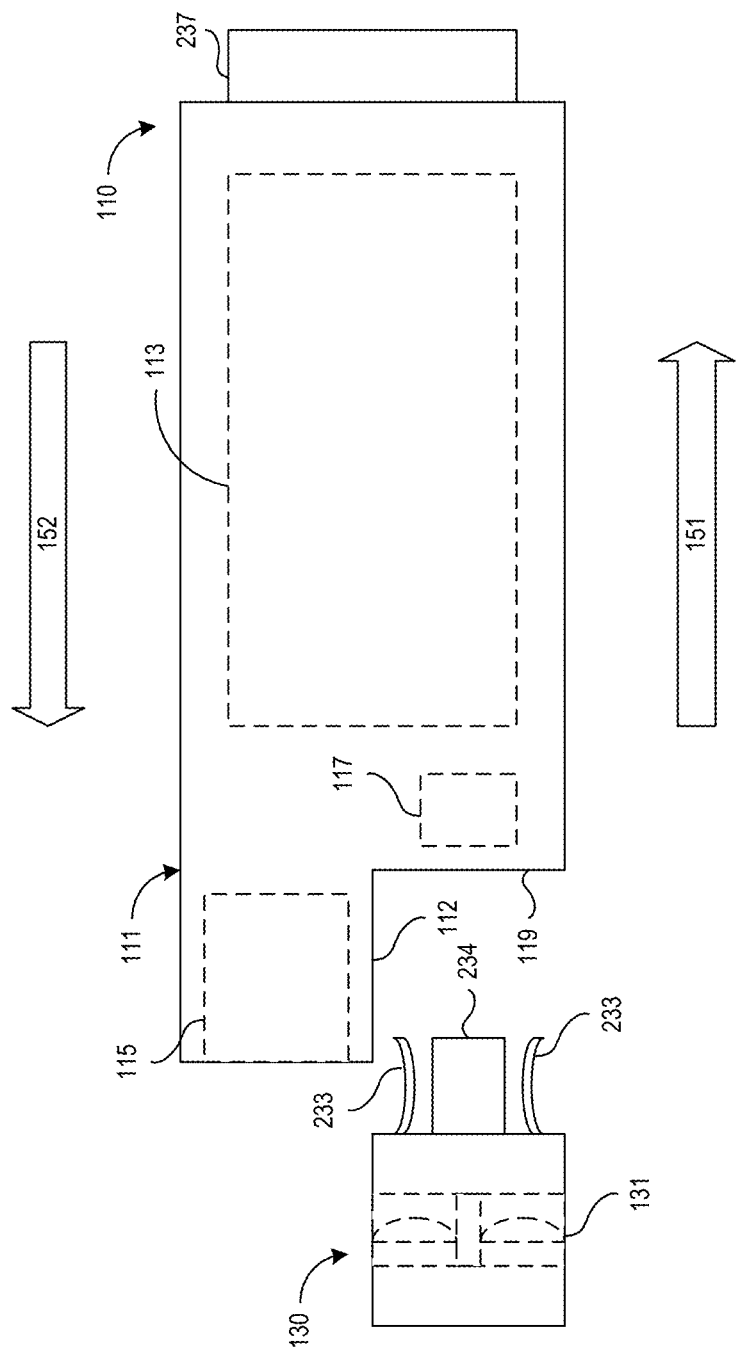
FIG. 3A illustrates an overhead view of a power supply and a fan module in accordance with one or more embodiments of the present disclosure.

FIG. 3A illustrates an overhead view of a power supply 110 and a fan module 130 in accordance with one or more embodiments of the present disclosure. The power supply 110 and the fan module 130 are illustrated before the fan module 130 is coupled to the power supply 110.

The fan module 130 includes one or more attachment members 233, a connector 235, a housing 131, and a fan unit 233 as discussed above. The connector 235 may couple the fan module 130 to the power supply and may allow the fan module 130 to receive power from the power supply 110. The power (received from the power supply 110) may be used to operate the fan unit 131. The fan unit 131 may generate an air flow that goes in the direction of arrow 151 or in the direction or arrow 152. The fan module 130 may include a memory to store configuration parameters, as discussed above. The attachment members 233 may be configured to align or interface with the connector 117. For example, the attachment members 233 may be configured to contact the outer faces of the connector 117. This may align the connector 117 with the connector 235 when the fan module 130 is coupled to the power supply (e.g., is inserted into the space in the housing 111).

Although the attachment members 233 are illustrated as part of the fan module 130, the attachment members 233 may be located in other components or there may be more attachment members in other embodiments. For example, the attachment members 233 may be located proximate to the connector 117 within the housing 111. In another example, the power supply 110 may include additional attachment members that may interface with or align with the attachment members 233.

The power supply 110 includes a connector 115 to couple the power supply 110 to an external power source, as discussed above. The power supply 110 also includes a power generation unit 113, as discussed above. The power generation unit 113 may convert power, boost voltage, decrease voltage, condition power, generate power, etc., as discussed above. The power supply 110 further includes a connector 117 to couple the fan module 130 to the power supply 110, as discussed above. The power supply 110 may also include a connector 237 that couples the power supply 110 to the electronic device, as discussed above. The power supply 110 may also include a controller that may obtain one or more configuration parameters from the fan module 130 and may determine whether the fan module 130 is compatible with the power supply 110 (based on the configuration parameters), as discussed above.

The power supply 110 includes a housing 111, as discussed above. The housing 111 of the power supply 110 interfaces with the housing 131 of the fan module 130 when the fan module 130 is coupled to the power supply 110 (e.g., walls 112 and 119 interface with housing 131), as discussed above. In some embodiments, the housing 111 and/or the housing 131 may include various alignment features that may allow the housing 111 to interface with the housing 131.

As discussed above, the shape of the housing 111 allows the housing 111 to interface with multiple different fan modules. Also as discussed above, the connector 117 and the connectors of the fan modules may be aligned/positioned such that the connectors 117 will couple with the connectors of the fan modules when the fan modules are inserted into the space in the housing 111. Using fan modules with similar/identical housings, the same connectors, and/or same positions/locations for the connectors may provide the ability to interchange the fan modules coupled to the power supply 110. The ability to interchange the different fan modules with different power supplies may provide various benefits (e.g., more efficient manufacturing process, cheaper manufacturing, the ability to customize the power supply 110 to the requirements of the electronic device/environment, easier maintenance/upgrading, etc.), as discussed above.

Figure 3B:
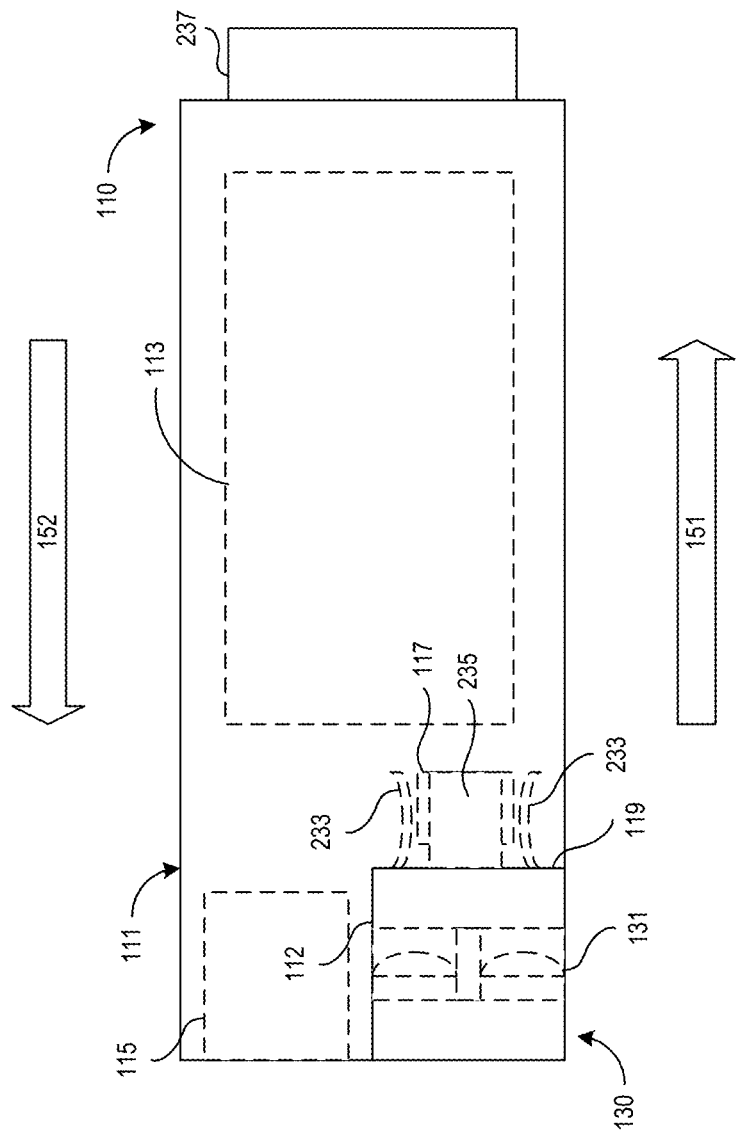
FIG. 3B illustrates an overhead view of a power supply and a fan module in accordance with one or more embodiments of the present disclosure.

FIG. 3B illustrates an overhead view of a power supply 110 and a fan module 130 in accordance with one or more embodiments of the present disclosure. The power supply 110 and the fan module 130 are illustrated after the fan module 130 is coupled to the power supply 110.

The fan module 130 includes one or more attachment members 233, a connector 235, a housing 131, and a fan unit 233 as discussed above. The connector 235 may couple the fan module 130 to the power supply and may allow the fan module 130 to receive power from the power supply 110. The power (received from the power supply 110) may be used to operate the fan unit 131. The fan unit 131 may generate an air flow that goes in the direction of arrow 151 or in the direction or arrow 152. The fan module 130 may include a memory to store configuration parameters, as discussed above. As illustrated in FIG. 2B, the attachment members 233 align or interface with the connector 117. The attachment members 233 may be configured to contact the outer faces of the connector 117 in order to align the connector 117 with the connector 235 when the fan module 130 is coupled to the power supply (e.g., is inserted into the space in the housing 111). This allows the connector 117 to be properly coupled with connector 235

Although the attachment members 233 are illustrated as part of the fan module 130, the attachment members 233 may be located in other components or there may be more attachment members in other embodiments. For example, the attachment members 233 may be located proximate to the connector 117 within the housing 111. In another example, the power supply 110 may include additional attachment members that may interface with or align with the attachment members 233.

The power supply 110 includes a connector 115 to couple the power supply 110 to an external power source, as discussed above. The power supply 110 also includes a power generation unit 113, as discussed above. The power generation unit 113 may convert power, boost voltage, decrease voltage, condition power, generate power, etc., as discussed above. The power supply 110 further includes a connector 117 to couple the fan module 130 to the power supply 110, as discussed above. The power supply 110 may also include a connector 237 that couples the power supply 110 to the electronic device, as discussed above. The power supply 110 may also include a controller that may obtain one or more configuration parameters from the fan module 130 and may determine whether the fan module 130 is compatible with the power supply 110 (based on the configuration parameters), as discussed above.

The power supply 110 includes a housing 111, as discussed above. The housing 111 of the power supply 110 interfaces with the housing 131 of the fan module 130 when the fan module 130 is coupled to the power supply 110 (e.g., walls 112 and 119 interface with housing 131), as discussed above. In some embodiments, the housing 111 and/or the housing 131 may include various alignment features that may allow the housing 111 to interface with the housing 131. The resulting combination of the power supply 110 and the fan module 130 has the general shape of a rectangle or a rectangular prism, although other shapes may be formed in other embodiments.

As discussed above, the shape of the housing 111 allows the housing 111 to interface with multiple different fan modules. Also as discussed above, the connector 117 and the connectors of the fan modules may be aligned/positioned such that the connectors 117 will couple with the connectors of the fan modules when the fan modules are inserted into the space in the housing 111. Using fan modules with similar/identical housings, the same connectors, and/or same positions/locations for the connectors may provide the ability to interchange the fan modules coupled to the power supply 110. The ability to interchange the different fan modules with different power supplies may provide various benefits (e.g., more efficient manufacturing process, cheaper manufacturing, the ability to customize the power supply 110 to the requirements of the electronic device/environment, easier maintenance/upgrading, etc.), as discussed above.

Figure 4:
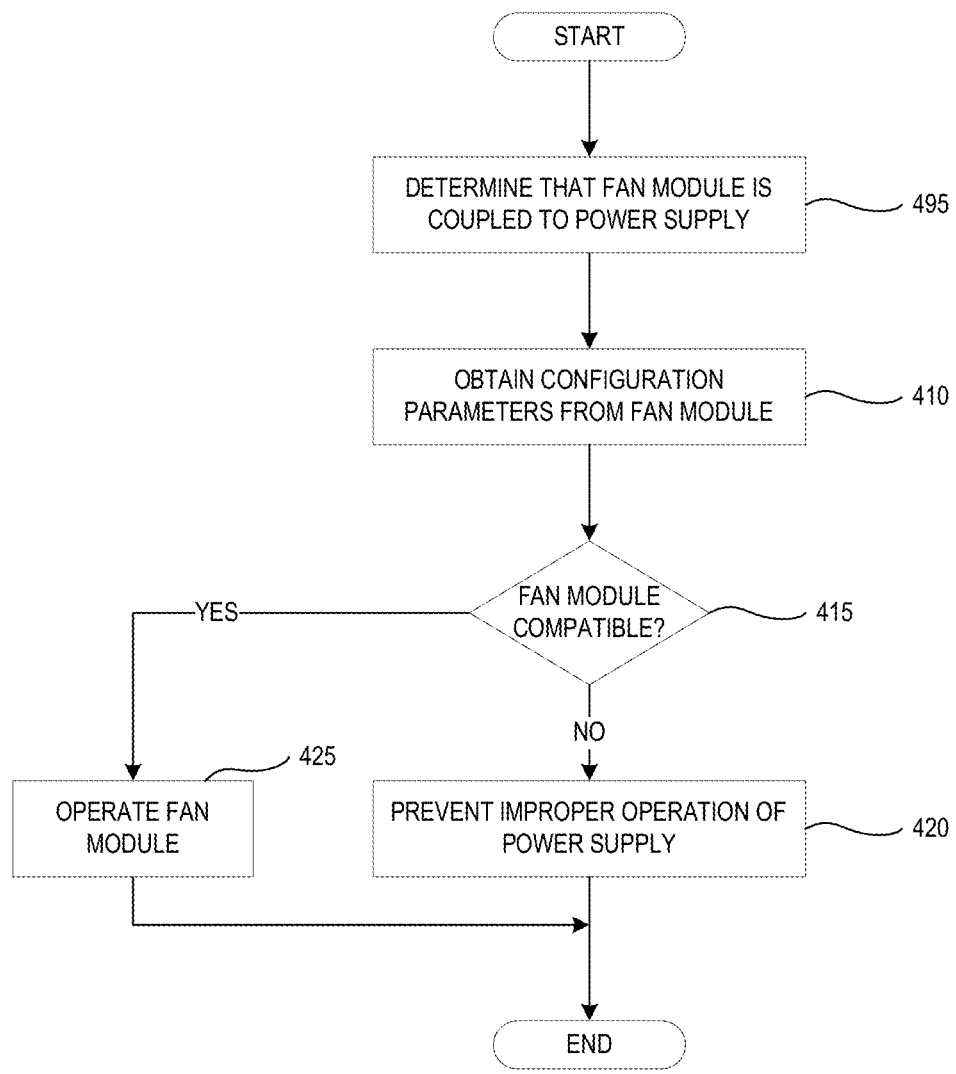
FIG. 4 illustrates a flow diagram of a method for transmitting packets in a network in accordance with one or more embodiments of the present disclosure.

FIG. 4 is a flow diagram of a method 400 of operating a power supply in accordance with some embodiments of the present disclosure. Method 400 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, the method 400 may be performed by a controller, a power supply, and/or an electronic device.

The method 400 begins at block 405 where the method determines whether a fan module is coupled to a power supply. As discussed above, a first housing of the power supply is configured to interface with a second housing of the fan module. One or more attachment members of the fan module are configured to interface with a first connector of the power supply, as discussed above. The first connector is configured to couple with a second connector of the fan module, as discussed above. The power supply may provide power to the fan module via the first connector and the second connector, as discussed above. The power supply may determine whether the fan module is coupled by communicating data and/or signals with the fan module via the first connector and the second connector. For example, the power supply may detect a signal transmitted by the fan module, or may transmit a message to the fan module and wait for a response message.

At block 410, the method 400 obtains configuration parameters of the fan module. For example, the power supply may access a memory of the fan module and may read the configuration parameters from the memory. In another example, the power supply may transmit a message requesting the configuration parameters and the fan module may transmit the configuration parameters to the power supply. The method 400 may determine whether the fan module is compatible with the power supply based on the configuration parameters at block 415. For example, the power supply may determine whether one or more of the direction of airflow, the airflow rate, the RPMs, the noise level, etc., are suitable to provide cooling for the power supply and/or power supply components, as discussed above.

If the fan module is compatible with the power supply, the power supply may operate the fan module at block 425. For example, the power supply may provide power to the fan module so that the fan module may operate a fan unit (of the fan module) using the power. The power supply may also begin operating at block 425. For example, the power supply may begin to generate power for the electronic device. If the fan module is not compatible with the power supply, the power supply may prevent improper operation of the power supply at block 420. For example, the power supply may refrain from operating a power generation unit (e.g., may refrain from generating power) because the fan module may not be sufficient to cool the power supply. This may also prevent damage to the power supply. In another example, the power supply may provide an indication that the fan module is not compatible with the power supply. For example, the power supply may light up or blink and LED. In another example, the power supply may transmit a message to the electronic device (e.g., to a processor or controller of the electronic device) indicating that the fan module is not compatible with the power supply.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. In addition, the term "set" includes one or more items within the set. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A power supply, comprising:
    a first housing configured to interface with one or more of housings of one or more fan modules;
    a power generation unit disposed within the first housing, the power generation unit configured to generate power for an electrical device;
    a first connector disposed within the first housing, the first connector configured to provide power to the one or more fan modules, wherein the power is used to operate one or more fan units of the one or more fan modules; and
    a controller configured to obtain configuration parameters of the one or more fan modules and to determine whether the one or more fan modules are compatible with the power supply based on the configuration parameters, wherein the controller determines whether the one or more fan modules are compatible based on airflow rate parameters included in the configuration parameters.

2. The power supply of claim 1, wherein a portion of the first housing is configured to accept the one or more fan modules, and wherein a shape of the power supply and the one or more fan modules after the one or more fan modules are coupled to the power supply comprises a geometric shape.

3. The power supply of claim 1, wherein the first connector is further configured to couple with one or more connectors of the one or more fan modules.

4. The power supply of claim 3, wherein the first connector is configured to align with the one or more connectors of the one or more fan modules and is configured to align with one or more attachment members of the one or more fan modules.

5. The power supply of claim 1, wherein the controller determines whether the one or more fan modules are compatible further based on airflow direction parameters of the one or more fan modules included in the configuration parameters.

6. The power supply of claim 5, wherein the controller is further configured to:
    in response to determining that the one or more fan modules are incompatible with the power supply, provide an indication that the one or more fan modules are incompatible with the power supply to a second controller of an electronic device that receives power from the power supply.

7. The power supply of claim 5, wherein the controller is further configured to:
    in response to determining that the one or more fan modules are incompatible with the power supply, refrain from operating the power generation unit.

8. The power supply of claim 5, wherein the configuration parameters are obtained from the one or more fan modules via the first connector.

9. The power supply of claim 1, further comprising second connector, wherein the second connector is configured to couple the power supply to an electronic device.

10. A fan module, comprising:
    a first housing configured to interface with one or more housings of one or more power supplies;
    a fan unit disposed within the first housing, the fan unit configured to generate an airflow;
    a first attachment member configured to interface with one or more connectors of the one or more power supplies;
    a first connector configured to receive power from the one or more power supplies and provide the power to the fan unit; and
    a memory configured to store configuration parameters including an airflow rate parameter of the fan module, wherein the configuration parameters allow the one or more power supplies to determine whether the fan module is compatible with the one or more power supplies.

11. The fan module of claim 10, wherein a shape of the power supply and the one or more fan modules after the one or more fan modules are coupled to the power supply comprises a geometric shape.

12. The fan module of claim 10, wherein the first connector is further configured to couple with one or more connectors of the one or more power supplies.

13. The fan module of claim 12, wherein the first attachment member is configured to align the first connector with the one or more connectors of the one or more power supplies.

14. The fan module of claim 10, wherein the memory is further configured to store airflow direction parameters, wherein the airflow direction parameters further allow the one or more power supplies to determine whether the fan module is compatible with the one or more power supplies.

15. The fan module of claim 10, wherein the fan module is configured to provide the configuration parameters to one or more controllers of the one or more power supplies.

16. The fan module of claim 10, wherein the configuration parameters are provided to the one or more power supplies via the first connector.

17. A power supply, comprising:
    a power supply unit comprising:
        a first housing configured to interface with one or more of housings of one or more fan modules;
        a power generation unit disposed within the housing, the power generation unit configured to generate power for an electrical device;
        a first connector disposed within the first housing, the first connector configured to provide power to the one or more fan modules, wherein the power is used to operate one or more fan units of the one or more fan modules; and
        a controller configured to obtain configuration parameters of the one or more fan modules and to determine whether the one or more fan modules are compatible with the power supply based on the configuration parameters, wherein the controller determines whether the one or more fan modules are compatible based on airflow rate parameters included in the configuration parameters; and a fan module comprising:
- a second housing configured to interface with the first housing;
- a fan unit disposed within the second housing, the fan unit configured to generate an airflow through the first housing;
- a first attachment member configured to interface with the first connector;
- a second connector configured to receive power from the one or more power supplies and provide the power to the fan unit; and
- a memory configured to store the configuration parameters including the airflow rate parameter.

18. A method, comprising:

determining whether a fan module is coupled to a power supply, wherein a first housing of the power supply is configured to interface with a second housing of the fan module, wherein an attachment member of the fan module is configured to interface with a first connector of the power supply, and wherein the first connector is configured to couple with a second connector of the fan module;

obtaining configuration parameters of the fan module, the configuration parameters including airflow rate parameters;

determining whether the fan module is compatible with the power supply based on the configuration parameters including the airflow rate parameters; and in response to determining that the fan module is not compatible with the power supply, preventing improper operation of the power supply.

19. The method of claim 18, wherein preventing improper operation of the power supply comprises:

providing an indication that the one or more fan modules are incompatible with the power supply to a second controller of an electronic device that receives power from the power supply.

20. The method of claim 18, wherein preventing improper operation of the power supply comprises:

refraining from operating the power generation unit.

21. The method of claim 18, further comprising:

one or more of operating the power generation unit or operating the fan module in response to determining that the fan modules is compatible with the power supply.

* * * * *